United States Patent [19]
Gilmer et al.

[11] Patent Number: 5,904,542
[45] Date of Patent: May 18, 1999

[54] PERFORMING A SEMICONDUCTOR FABRICATION SEQUENCE WITHIN A COMMON CHAMBER AND WITHOUT OPENING THE CHAMBER BEGINNING WITH FORMING A FIELD DIELECTRIC AND CONCLUDING WITH A GATE DIELECTRIC

[75] Inventors: Mark C. Gilmer, Austin; Mark I. Gardner, Cedar Creek; Thomas E. Spikes, Round Rock, all of Tex.

[73] Assignee: Advanced Micro Devices, Inc.

[21] Appl. No.: 08/825,015

[22] Filed: Mar. 26, 1997

[51] Int. Cl.$^6$ .................................................. H01L 21/76
[52] U.S. Cl. ............................................ 438/439; 438/913
[58] Field of Search ..................................... 438/439, 913, 438/FOR 229, FOR 230; 148/DIG. 85, DIG. 86

[56] References Cited

U.S. PATENT DOCUMENTS

| | | |
|---|---|---|
| 4,281,031 | 7/1981 | Hillman et al. . |
| 4,789,645 | 12/1988 | Caviello et al. . |
| 4,876,216 | 10/1989 | Tobias et al. . |
| 4,951,601 | 8/1990 | Maydan et al. . |
| 5,426,076 | 6/1995 | Moghadam . |
| 5,433,794 | 7/1995 | Fazan et al. . |
| 5,498,577 | 3/1996 | Fulford, Jr. et al. . |
| 5,498,578 | 3/1996 | Steele et al. . |
| 5,589,233 | 12/1996 | Law et al. . |
| 5,609,737 | 3/1997 | Fukui et al. . |
| 5,652,166 | 7/1997 | Sun et al. . |
| 5,696,019 | 12/1997 | Chang . |
| 5,804,471 | 9/1998 | Yamazaki et al. . |

FOREIGN PATENT DOCUMENTS 4-177735  6/1992  Japan .

OTHER PUBLICATIONS

"High Technology Manufacturing . . . " E L Hu, Emerging Technologies for In Situ Processing. Proceedings of the NATO Advanced Research Workshop, 1988, 1 page (abstract only).

*Primary Examiner*—George Fourson
*Attorney, Agent, or Firm*—Kevin L. Daffer; Robert C. Kowert; Conley, Rose & Tayon

[57] ABSTRACT

An in situ process is provided for isolating semiconductor devices according to a LOCOS process. The invention contemplates performing field oxide growth, nitride layer removal, sacrificial oxide growth and removal, and gate oxide growth all within a single chamber without removing the wafers from the chamber during processing. The invention is believed to result in increased yields and process throughput by reducing the exposure of the wafers to outer-chamber contaminants, thermal stress, and transportation damage, as well as reducing inter-chamber transportation time. The invention also contemplates an in situ processing chamber adapted for performing field oxide growth, nitride layer removal, sacrificial oxide growth and removal, and gate oxide growth as part of a LOCOS isolation process. The in situ processing chamber is adapted for thermal oxidation and etching processes to implement the LOCOS isolation structure. A conventional oxidation furnace may be adapted to provide the in situ processing chamber by adapting the oxidation furnace to accept etchant gasses. Other conventional chambers or a specialized chamber may also be adapted according to the present invention for the in situ LOCOS process.

15 Claims, 3 Drawing Sheets

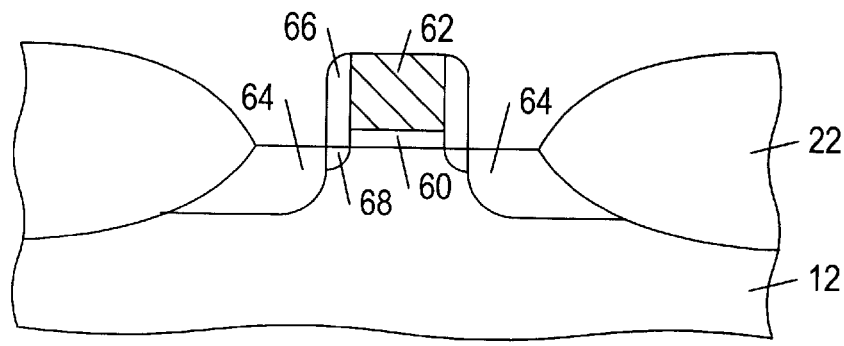
FIG. 7
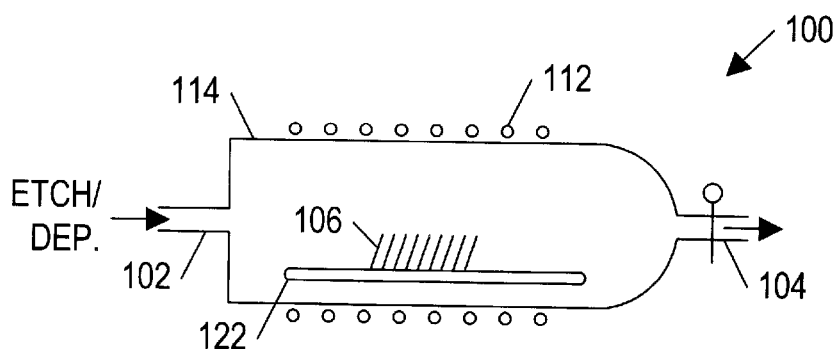
FIG. 8
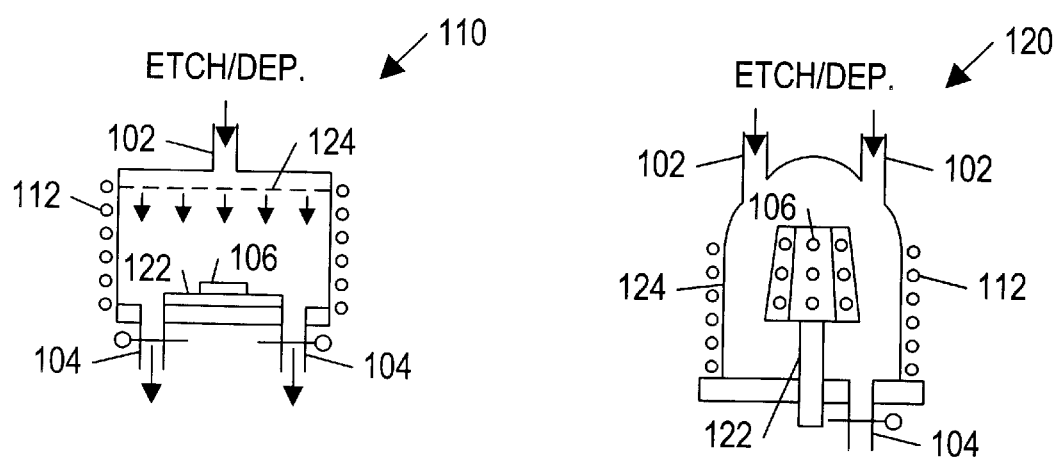
FIG. 9
FIG. 10

PERFORMING A SEMICONDUCTOR FABRICATION SEQUENCE WITHIN A COMMON CHAMBER AND WITHOUT OPENING THE CHAMBER BEGINNING WITH FORMING A FIELD DIELECTRIC AND CONCLUDING WITH A GATE DIELECTRIC

BACKGROUND OF THE INVENTION

1. Field of the Invention

This invention relates to semiconductor fabrication and more particularly to an improved process of isolating active regions within a semiconductor substrate. The improved isolation process involves growing a field oxide, removing a nitride layer, growing and subsequently removing a Kooi oxide, and forming a gate oxide all within a single chamber without opening the chamber to an atmospheric ambient.

2. Description of the Relevant Art

The fabrication of an integrated circuit involves placing numerous devices in a single semiconductor substrate. Select devices are interconnected by a conductor which extends over a dielectric which separates or "isolates" those devices. Implementing an electrical path across a monolithic integrated circuit thereby involves selectively connecting isolated devices. When fabricating integrated circuits it must therefore be possible to isolate devices built into the substrate from one another. From this perspective, isolation technology is one of the critical aspects of fabricating a functional integrated circuit.

Metal oxide semiconductor (MOS) transistors (i.e., devices) are typically formed in isolated active device regions of a frontside surface of a semiconductor substrate. These active device regions are separated by field regions. Electrically insulating layers of silicon dioxide (i.e., oxide) are usually formed over the field regions (i.e., field oxide), and the MOS transistors are electrically coupled by conductive trace elements called interconnects. An interconnect which overlies field oxide between device active areas may inappropriately function as a gate electrode of a parasitic MOS transistor formed between diffused regions of two adjacent MOS devices. Certain measures must be taken to ensure that any possible operating voltage present between the interconnect and the underlying silicon substrate is not sufficient to invert the substrate surface beneath the interconnect. If the substrate beneath field oxide is allowed to invert, a conductive channel will form between the diffused regions of the parasitic MOS transistor. Current flow through parasitic MOS transistors will either cause more power to be dissipated than expected or, in the extreme, cause the circuit to malfunction.

To avoid parasitic conditions, it becomes necessary to raise the turn-on threshold of any parasitic MOS transistors formed in the field regions. One way to raise the turn-on threshold of parasitic MOS transistors is to increase the thickness of the field oxide. Alternatively, or in addition to increasing field oxide thickness, field region doping levels can be increased.

A popular isolation technology used for an MOS integrated circuit involves the process of locally oxidizing silicon. Local oxidation of silicon, or LOCOS, involves oxidizing field regions between devices. The oxide grown in field regions are termed field oxide, wherein field oxide is grown during the initial stages of integrated circuit fabrication, typically before source and drain implants are placed in device areas or active areas. By growing a thick field oxide in isolation (or field) regions pre-implanted with a channel-stop dopant, LOCOS processing serves to prevent the establishment of parasitic channels in the field regions.

While LOCOS has remained a popular isolation technology, it involves many process steps that are conventionally performed in separate processing chambers. The semiconductor wafers are first placed in a thermal oxidation furnace where a pad oxide is grown. The wafers are then removed from the thermal oxidation furnace and transported to a chemical vapor deposition (CVD) chamber where a silicon nitride ($Si_xN_y$) layer is deposited over the pad oxide. A layer of photoresist is then deposited over the nitride layer. Deposition of photoresist may also involve a separate chamber. The photoresist is then patterned to define active regions and field regions. Patterning of the photoresist is accomplished by exposing selected areas of the photoresist to ultraviolet light. The exposed areas polymerize and become resistant to etching. The wafers are then transferred to a dry etch chamber where the non-polymerized areas are removed. The wafers may then be transferred to a wet etch chamber for removal of the pad oxide over the field regions. The wafers may then be transferred to an implantation chamber where a channel-stop implant is performed. Next the wafers may be transferred back to an etching chamber for stripping of the remaining photoresist. Then the wafers are moved to a thermal wet or dry oxidation chamber where the field oxide is grown. After the field oxide is grown, the wafers are transported to an etch chamber to remove the nitride layer.

During growth of the field oxide, a thin layer of silicon nitride may have formed at the pad oxide/silicon interface near the active region borders, as a result of the reaction between the oxidizing agent and the silicon nitride. The formation of nitride at the edge of the field oxide at the oxide/silicon juncture is called the "Kooi effect". The unwanted nitride or "Kooi ribbon" causes localized thinning of any subsequently grown gate oxide. Thus, to remove the Kooi nitride, the wafers may be moved to an oxidation chamber to grow the pad oxide further in the active regions to consume the Kooi ribbon. Then, the wafers may be moved to a wet etch chamber where the grown oxide is removed. Thus, the grown oxide is termed a "sacrificial oxide". The wafers may then be moved to a dry oxidation chamber to grow the gate oxide. A defect-free, high quality gate oxide without contamination is essential for proper device operation. Finally, the semiconductor devices may be created by depositing and patterning a polysilicon gate over the gate oxide and then doping the source and drain regions.

The LOCOS process described above is a complex process involving many different processing steps. Wafers frequently must be transported between processing chambers. This frequent moving of the wafers inflicts several problems into the process. Repeated moving of the wafers may impose a risk of damaging the wafers. Also, repeated thermal cycling when wafers are moved from warm or thermal processes may result in stress damage to device structures. Furthermore, each time the wafers are removed from a processing chamber, they may be exposed to contaminants that may result in lowering yield. Finally, transportation of wafers between chambers is time consuming and lowers process throughput and efficiency. These effects increase the overall cost of fabrication.

A need therefore exists in producing a process which can advantageously perform LOCOS isolation with a reduction in the aforedescribed detrimental effects of the conventional LOCOS process. Thus, it is desirable to have a process that may impose less risk of damaging the wafers. It is further desirable to have a process that may lessen thermal stress when wafers are removed from processing chambers. Also, it is desirable to lessen the exposure to contaminants outside processing chambers. Moreover, it is desirable to increase the throughput and efficiency of the LOCOS process, thereby lowering overall production cost.

SUMMARY OF THE INVENTION

The problems outlined above are in large part solved by the improved LOCOS process and processing chamber of the present invention. The improved process hereof serves to form LOCOS isolation by a substantially in situ process, i.e., a process performed substantially in a single chamber without removing the wafers from the chamber.

The invention contemplates a process for creating a LOCOS isolation structure to isolate semiconductor devices formed in active regions of a semiconductor substrate. The process may include providing a semiconductor substrate on which a pad oxide layer is grown or deposited and a nitride layer has been formed. Using lithography, the pad oxide and nitride layers are patterned to define field regions and active regions on the semiconductor substrate. The LOCOS isolation process is then performed in situ according to the present invention. The semiconductor substrate is placed within an in situ processing chamber according to the present invention. A field oxide is grown by a thermal oxidation process and as defined by the nitride layer. Next, the nitride layer is removed by a preferably dry etch process where the etchant is diluted in an inert gas. The pad oxide layer may also be removed by a similar etching process. Whether or not the pad oxide layer is removed the semiconductor topography may then again be exposed to a thermal oxidation process in order to grow a sacrificial oxide in the active regions to a depth within the semiconductor substrate below any Kooi ribbon that may have formed during the field oxidation process. This sacrificial oxide layer is then removed in another etch process using an etchant diluted in an inert gas. The sacrificial oxide is removed to a depth such that Kooi ribbon is also removed. Then, the semiconductor topography may be exposed to another thermal oxidation process directed toward growing a gate oxide. Thereafter, further processing steps may be performed to create a polysilicon gate structure and source/drain regions to create semiconductor devices within the active regions of the silicon substrate.

According to the present invention the field oxide growth, nitride removal, sacrificial Kooi oxide growth, sacrificial Kooi oxide removal, and gate oxide growth processes may all be performed in situ, i.e., in a single chamber without removing the wafers from the in situ chamber. The in situ LOCOS process of the present invention may result in a higher yield and more efficient fabrication process. By in situ processing of the present invention the wafers are exposed to fewer outer chamber contaminants, subjected to less risk of damage during inter-chamber transportation, subjected to less inter-chamber thermal stress, and benefit from more efficient and higher throughput processing.

The present invention also contemplates an in situ processing chamber for the LOCOS isolation process. The invention contemplates the modification of a conventional process chamber, such as an oxidation furnace, to allow for substantial in situ processing of LOCOS isolation. For example, an oxidation furnace may be adapted to accept etchant gasses suitable for the nitride and sacrificial oxide removal processes. Such etchant gasses may be $NF_3$ or $ClF_3$, diluted within an inert gas. Alternatively, other types of conventional chambers such as a CVD chamber, etch chamber, or barrel reactor may be adapted for the in situ LOCOS processing of the current invention. For example a CVD chamber may be adapted with a heating element and adapted to receive oxygen for the thermal oxide growth processes and adapted to receive an etchant gas for the removal processes. Alternatively, an etchant chamber may be adapted to allow for the thermal growth processes by adding an oxygen source and heating elements. Moreover the present invention contemplates a specialized chamber created for in situ processing of LOCOS isolation.

Broadly speaking, according to the present invention, any combination of the thermal oxide growth, nitride removal, sacrificial oxide growth, sacrificial oxide removal, and gate oxide growth processes of a LOCOS isolation process may be performed in situ within a single processing chamber. Thus, the wafers are not frequently subjected to outer chamber contaminants or thermal stresses. Also, the wafers are not subjected to frequent transportation damage risk. Furthermore, the throughput and efficiency of the LOCOS process is thereby enhanced since transportation time between chambers is largely eliminated for the LOCOS process.

BRIEF DESCRIPTION OF THE DRAWINGS

Other objects and advantages of the invention will become apparent upon reading the following detailed description and upon reference to the accompanying drawings in which:

FIG. 7 represents processing steps involved in creating a semiconductor device in the active regions of the semiconductor topography;

FIG. 8 is an illustration of a process tube adapted for in situ processing of multiple ones of the above illustrated processing steps;

FIG. 9 is an illustration of a reaction chamber adapted for in situ processing of multiple ones of the above illustrated processing steps; and FIG. 10 is an illustration of a barrel reactor adapted for in situ processing of multiple ones of the above illustrated processing steps.

Figure 1:
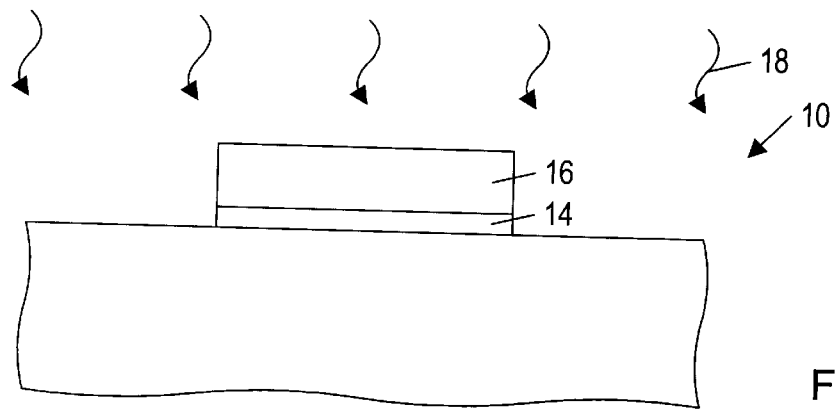
FIG. 1 is a partial cross-sectional view representing a processing step of exposing a semiconductor topography to thermal energy in an oxidizing ambient to grow a field oxide.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a processing step for exposing a semiconductor topography 10 to thermal energy 18 in an oxidizing ambient for the purpose of growing a field oxide. The semiconductor topography 10 includes a semiconductor substrate 12 which is preferably formed from single crystal silicon. A pad oxide layer 14 and a silicon nitride layer 16 have been patterned upon the semiconductor substrate 12. Pad oxide layer 14 comprises a silicon dioxide layer thermally grown to a typical thickness of 400 to 500 angstroms. Its function is to cushion the transition of stresses between silicon substrate 12 and the subsequently deposited nitride layer 16. The nitride layer 16 is typically a 1,000 to 2,000 angstrom thick layer deposited by a chemical vapor deposition CVD process. Nitride layer 16 is substantially oxygen impermeable and serves as an oxidation mask during the field oxide forming process.

Active regions and field regions are defined with a photolithographic step. A photoresist layer is patterned over nitride layer 16 and protects all areas on which active devices will later be formed. Nitride layer 16 is then dry etched and pad oxide layer 14 may be etched by a dry or wet chemical process. The result is the patterned pad oxide 14 and nitride 16 layers of FIG. 1 which protect and cover the active regions while leaving the field regions open for field oxide growth.

Before the field oxide is grown according to the thermal oxidation process of FIG. 1 a channel stop implant process may be performed. Also, a field implant process may be performed to enhance field oxide growth. After these implant processes the masking photoresist layer is stripped and semiconductor topography 10 is ready for the thermal field oxide growth process of FIG. 1.

In a processing chamber according to the present invention, semiconductor topography 10 is exposed to thermal energy represented by reference numeral 18 in an oxidizing ambient. The field oxide may be thermally grown by wet oxidation (i.e., in a moist, oxygen-bearing ambient) to a thickness ranging from around 2,000 to 10,000 angstroms depending upon the desired device technology.

Figure 2:
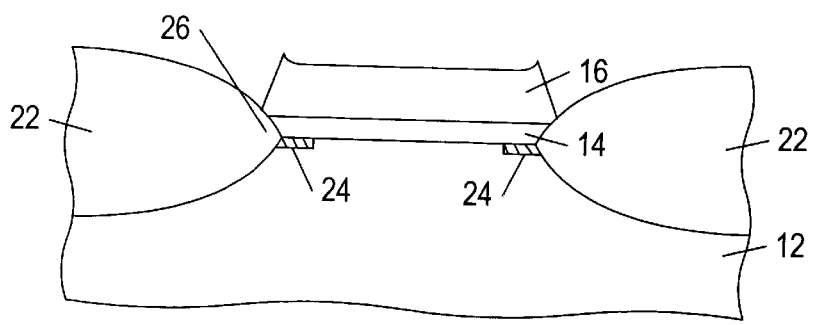
FIG. 2 is a partial cross-sectional view illustrating the semiconductor topography resulting from the processing step illustrated by FIG. 1, wherein a field oxide and Kooi ribbon are formed.

Turning now to FIG. 2 the result of the process illustrated by FIG. 1 is shown. Field regions are now covered by the thick field oxide 22. As can be seen from FIG. 2, the field oxide grows where there is no masking nitride layer 16. However, at the edges of nitride layer 16 the field oxide may grow laterally and lift the edges of nitride layer 16 as shown in FIG. 2. Because the shape of field oxide 22 at the edges of nitride layer 16 has a slowly tapering wedge shape that merges into pad oxide layer 14 it has been named a bird's beak structure. The bird's beak may detrimentally encroach into the active regions covered by nitride layer 16. Several process modifications are known within the art for minimizing the birds beak effect such as recessed LOCOS processes and polybuffered LOCOS processes. These processes may be incorporated into the present invention.

During the growth of field oxide 22 another phenomenon may occur that may cause defects when the gate oxide is later grown. This phenomenon is known as the Kooi effect and consists of a thin layer of silicon nitride 24 that forms at the pad oxide 14 and silicon substrate 12 interface close to the borders of the active regions. Kooi ribbon 24 forms around the perimeter of the active area and forms when nitrogen-hydrogen compounds defuse through pad oxide 14 during the field oxidation process. It is desirable to remove the Kooi ribbon 24. This is because if the Kooi ribbon 24 remains when the gate oxide is subsequently grown, the gate oxide will be thinner at these locations than elsewhere giving rise to problems of, e.g., low voltage breakdown of the gate oxide in the thin areas.

Figure 3:
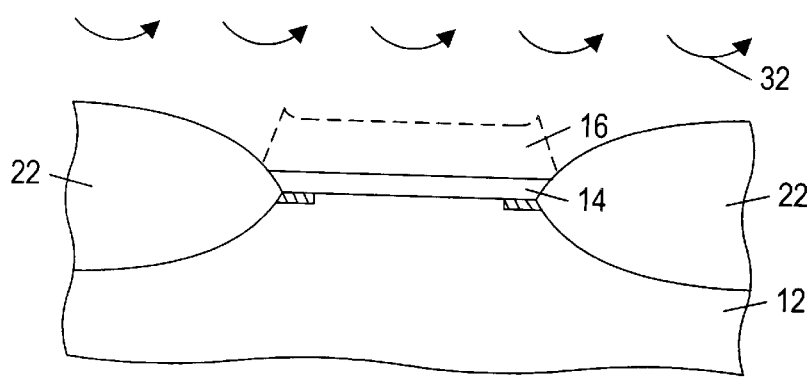
FIG. 3 represents a processing step of removing the nitride layer over active regions of the semiconductor topography.

FIG. 3 represents a processing step performed in the same chamber as the processing step of FIGS. 1–2 according to the present invention. FIG. 3 illustrates the processing step of removing nitride layer 16. The removal process is represented by reference numeral 32. Nitride Layer 16 is removed by an etch process. The etch process may use a $NF_3$ or $ClF_3$ acid diluted in an inert gas such as nitrogen or argon. Note that the nitride layer 16 removing process is preferably a dry etch process. However, the present invention may also be adapted to include a wet etch process. Furthermore, other acids in addition to those disclosed may be suitable for the removal process of FIG. 3 and are within the scope of the present invention.

Figure 4:
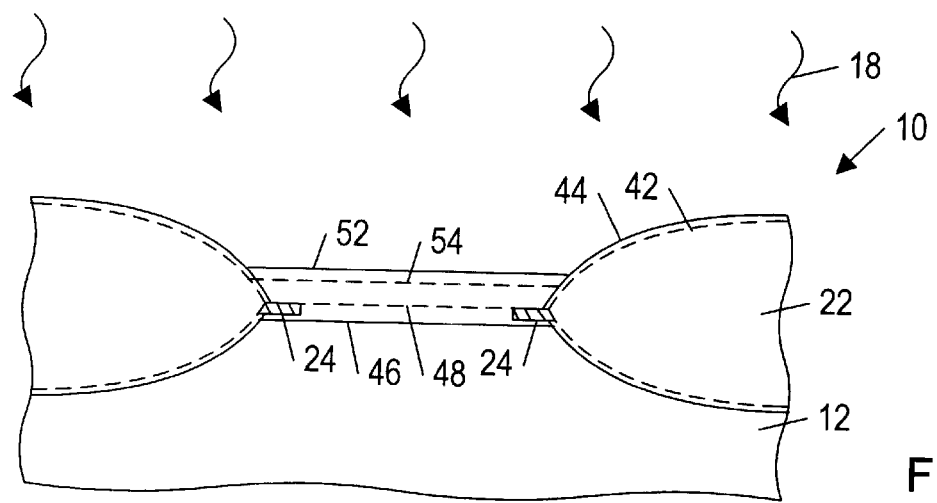
FIG. 4 represents a processing step of exposing the semiconductor topography to thermal energy in an oxidizing ambient to grow a sacrificial oxide below the Kooi ribbon.

Turning now to FIG. 4 an in situ processing step is illustrated. The processing step of FIG. 4 is performed within the same processing chamber as the processing steps of FIGS. 1–3. FIG. 4 represents a thermal oxidation step performed to grow an oxide layer into silicon substrate 12 wherein the oxide layer is grown to a depth 46 below the Kooi ribbon 24. Pad Oxide Layer 14 may be removed by a process similar to that described in FIG. 3 before the thermal oxide growth process of FIG. 4 is performed. Alternatively, the pad oxide layer 14 may remain and be further extended by the thermal oxidation process of FIG. 4. Reference numeral 48 indicates the lower elevation of pad oxide layer 14 which corresponds to the upper elevational level of silicon substrate 12 in FIG. 3. Reference numeral 56 indicates the upper elevational level of pad Oxide Layer 14 after the processing step of FIG. 3. Reference numerals 46 and 52 represent the lower and upper elevational levels respectively to which the oxide is extended by the thermal oxidation process of FIG. 4. Semiconductor topography 10 is exposed to thermal energy in an oxidizing ambient as referenced by reference numeral 18. Such exposure is maintained until the oxide grows to a depth below the Kooi ribbon 24 as represented by reference numeral 46. The field oxide grows very slightly during this step. The amount of grow is almost negligible compared to the oxide grown in the active region. Reference numeral 42 represents the original elevational level of field oxide 22 and reference numeral 44 represents the elevational level of field oxide 22 subsequent to the thermal oxidation process of FIG. 4. The oxide grown in the active region during this process may be referred to as a sacrificial oxide.

Figure 5:
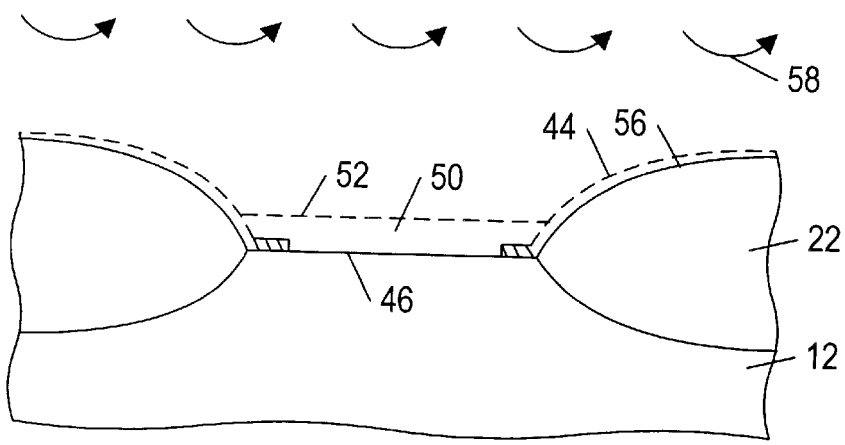
FIG. 5 represents a processing step of removing the sacrificial oxide to remove the Kooi ribbon.

Turning now to FIG. 5 a process subsequent to that of FIG. 4 is performed in situ, i.e., in the same chamber as that of FIGS. 1–4. FIG. 5 represents a removal process where the sacrificial oxide layer 50 is removed and wherein the Kooi ribbon 14 are removed along with the sacrificial oxide layer 50. The sacrificial oxide layer 50 is removed to a depth below the Kooi ribbon 24 as represented by reference numeral 46. A portion of the field oxide 22 may also be removed during this process. Reference numeral 44 indicates the elevational level of field oxide 22 after the thermal oxidation process of FIG. 4 and reference numeral 56 represents the elevational level of field oxide 22 after the removal process of FIG. 5.

The removal process of FIG. 5 is an etch process similar to that of FIG. 3. The removal process is indicated by reference numeral 58. Preferably the etch process comprises using dilute $NF_3$ or $ClF_3$ gas to perform the removal of sacrificial oxide 50. $NF_3$ or $ClF_3$ acid may be diluted for this process in an inert gas such as nitrogen or argon. The use of other appropriate acids is also within the scope of this invention. Although a dry etch process is preferable, the present invention may be adapted to utilize a wet etch process.

Figure 6:
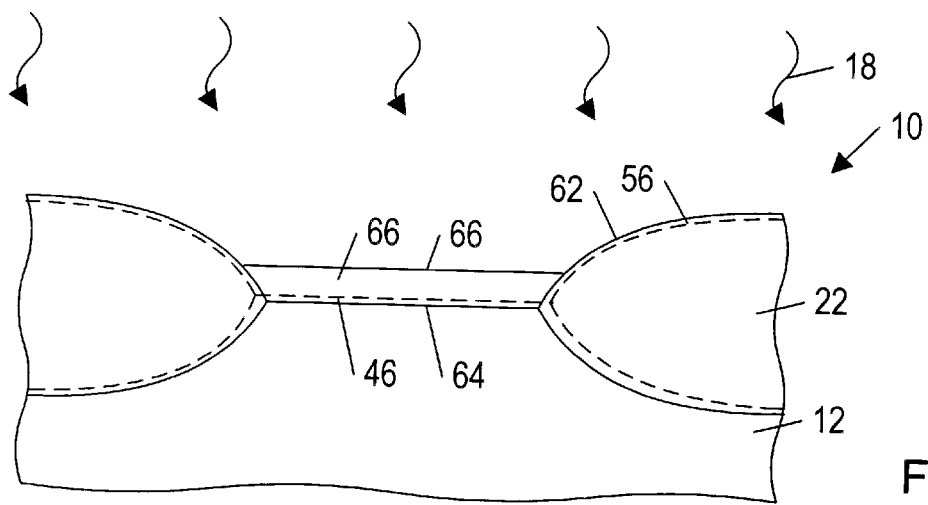
FIG. 6 represents a processing step of exposing the semiconductor topography to thermal energy in an oxidizing ambient to grow a gate oxide.

Turning now to FIG. 6 a process step is illustrated that may be performed in situ with the process steps of FIGS. 1–5. FIG. 6 represents a thermal oxidation process in which a gate oxide 60 is grown in the active regions of silicon substrate 12. Semiconductor topography 10 is exposed to thermal energy represented by reference numeral 18 in an oxidizing ambient. Gate oxide 60 is typically grown as thin as possible commensurate with oxide breakdown an reliability considerations. A thickness of 100 to 1,000 angstroms is typical. Gate oxide 60 grows into and above silicon substrate 12 in the active regions. Reference numeral 46 represents the active region elevational surface after the processing step of FIG. 5. Gate oxide 60 grows to a depth represented by reference numeral 64 and a height represented by reference numeral 66 in the active regions of silicon substrate 12. During this process field oxide 22 may also experience some growth. Reference numeral 56 represents the elevational level of field oxide 22 prior to the process of FIG. 6 and reference numeral 62 represents the elevational level of field oxide 22 subsequent to the process of FIG. 6.

According to the present invention the processing steps described for FIGS. 1–6 are advantageously performed in situ. Thus, these processing steps are performed in a single processing chamber adapted for performing each of the above-described processes. This in situ processing results in a higher quality gate oxide since semiconductor topography 10 was not required to be removed from and transported between various processing chambers during the processing steps of FIGS. 1–6. Also, semiconductor topography 10 was not exposed to any undesired thermal stresses resulting from removal from processing chambers since the above-described processes were performed in a single chamber. The in situ processing according to the present invention also reduces risk of wafer damage during transportation between chambers. Furthermore, in situ processing according to the present invention improves overall processing throughput and efficiency thereby reducing overall fabrication cost. Note that the present invention contemplates any combination of the processing steps for FIGS. 1–6 being performed in situ.

Turning now to FIG. 7 additional processing steps subsequent to that of FIG. 6 are illustrated. FIG. 7 represents the result of a lightly doped drain (LDD) process to create a semiconductor device in the active region of silicon substrate 12. Note that the processes represented by FIG. 7 are exemplary of processes that may be performed subsequent to those described for FIGS. 1–6. Other processes used to form semiconductor devices are within the scope of the present invention and may be combined with the in situ processing of FIGS. 1–6.

It has been determined that hot carrier effects will cause unacceptable performance degradation in devices with conventional drain structures built at small geometries. The LDD process is one process designed to overcome the hot carrier effect problems at small geometries. Two implant processes are used to create the source/drain regions in silicon substrate 12. One region, 68, is self aligned to the gate electrode 62 which has been patterned over gate oxide 60. The other implant, 64, is self aligned according to sidewall spacers 66. A first lighter implant is performed to create lightly doped regions 68. Sidewall spacers 66 are then formed along side gate electrode 62 and gate oxide 60. A heavier and deeper implant process is then performed to create dopant region 64 which is aligned by sidewall spacer 66. Since region 64 is further away from the channel than would be the case in a conventional structure, the depth of this heavily doped region 64 may be made somewhat greater without adversely impacting device operation. This spacing of doped regions 64 and 68 provide greater resistance to hot carrier effects. It is understood, as noted above, that other device structure processes may also easily be employed with the in situ processing of FIGS. 1–6.

FIGS. 8–10 are exemplary of various types of processing chambers adapted for in situ processing according to the present invention.

FIG. 8 illustrates a diffusion or thermal oxidation furnace 100 adapted as an in situ reaction chamber for processing multiple ones of the aforedescribed processing steps in a single chamber according to the present invention. The in situ chamber 100 comprises a tubular reaction chamber 114 for processing wafers 106. Wafers 106 may be received on wafer carrier 122. Wafers may be arranged substantially perpendicular to the gas flow, as shown, or alternatively, substantially parallel to the gas flow. Chamber 100 also includes an inlet port 102 adapted to provide either oxygen (and possibly a deposition gas) or an etchant into the reaction chamber 114. An external mechanism may be provide for supplying either oxygen or etchant gas, as desired, through inlet port 102. Outlet port 104 provides a means to exhaust the deposition or etchant gas from reaction chamber 114 between processing steps. For example, oxygen by first be supplied to reaction chamber 114 for the processing step of FIGS. 1–2. Oxygen is then removed and an etchant gas may be supplied for the processing step of FIG. 3. Next the etchant gas may be removed and oxygen again supplied for the processing step of FIG. 4. Outlet port 104 may be coupled to a vacuum supply.

Furthermore, between some or each of the processing steps, a purge cycle, which may include the use of any gas suitable for purging, may be run through reaction chamber 114 to remove the gaseous material from the processing step. In situ chamber 100 may also include a thermal energy source 112 adapted to provide thermal energy during some of the processing steps such as the oxide growth steps. Thermal energy source 112 may be a heating coil extending at least partially around the chamber. Alternatively, the thermal source may be located within chamber 114. For example, wafer holder 122 may be adapted to include a heating element. Furthermore, in situ chamber 100 may include electrodes for forming a plasma if a plasma etch process is desired for the etch processes, such as in FIG. 3. Furthermore, in situ chamber 100 may be adapted for atmospheric, low pressure, or high pressure processing.

FIG. 9 illustrates another example according to the present invention of a conventional processing chamber modified for in situ processing. In situ chamber 110 may be an anneal chamber modified for in situ thermal growth and etching processing steps as described for FIGS. 1–6 above. Similarly as described for in situ chamber 100, chamber 110 may include inlet port 102 and exhaust manifold 104 adapted for controlling the flow of gases for oxide growth, etching, and chemical vapor deposition. Exhaust manifold 104 may be coupled to a vacuum supply. Chamber 112 may include thermal source 112 and may also be adapted to include plasma electrodes 122 and 124, wherein wafer holder 122 has been modified to serve as an electrode. In general, chamber 110 is adapted for in situ processing of thermal field oxide growth, nitride etching, sacrificial oxide growth and etching, and gate oxide growth.

FIG. 10 illustrates another example according to the present invention of a conventional processing chamber modified for in situ processing. In situ chamber 120 may be a barrel reactor modified for in situ thermal growth and etching processing steps as described for FIGS. 1–6 above. Similarly as described for in situ chambers 100 and 110, chamber 120 may include inlet manifold 102 and exhaust port 104 adapted for controlling the flow of gases for oxide growth, etching, and possibly chemical vapor deposition. Exhaust port 104 may be coupled to a vacuum supply. Chamber 120 may include thermal source 112 and may also be adapted to include plasma electrodes 122 and 124. For example, wafer holder 122 may be adapted to supply RF power as the positive plasma electrode and chamber walls 124 may be adapted to serve as the ground electrode, for example, by grounding the chamber wall shielding. In general, chamber 120 is adapted for in situ processing of thermal field oxide growth, nitride etching, sacrificial oxide growth and etching, and gate oxide growth.

The present invention encompasses adaptations of conventional processing chambers to function as in situ processing chambers for thermal field oxide growth, nitride etching, sacrificial oxide growth and etching, and gate oxide growth processes. It is further contemplated by the present invention that the chamber may be further modified to provide for additional processing steps as describe in conjunction with FIG. 1 and for FIG. 7, supra. Furthermore, instead of modifying conventional processing chambers, a specialized chamber may be employed that provides for in situ processing thermal field oxide growth, nitride etching, sacrificial oxide growth and etching, and gate oxide growth processes as described above.

It will be appreciated to those skilled in the art having the benefit of this disclosure that this invention is capable of applications with numerous types of numerous semiconductor processes for creating integrated circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:
   providing a semiconductor substrate having a pad oxide layer and a substantially oxygen impermeable layer patterned on said semiconductor substrate to define active regions and field regions of said semiconductor substrate;
   within a common chamber and without opening the chamber, performing the steps of:
      growing a field oxide substantially in said field regions;
      removing the substantially oxygen impermeable layer;
      growing a sacrificial oxide layer in said active regions; and
      removing said sacrificial oxide layer to provide a substantially defect free surface at said active regions.

2. The method as recited in claim 1, further comprising:
   growing a gate oxide in said active regions after said removing said sacrificial oxide layer, wherein said growing a gate oxide is performed in the common chamber without opening the common chamber.

3. The method as recited in claim 1, wherein said growing a field oxide comprises supplying thermal energy to said semiconductor substrate in an oxidizing ambient.

4. The method as recited in claim 1, wherein said growing a field oxide results in Kooi ribbon forming below said pad oxide near said active regions' borders.

5. The method as recited in claim 1, wherein said removing the substantially oxygen impermeable layer comprises subjecting the substantially oxygen impermeable layer to an etchant.

6. The method as recited in claim 5, wherein said etchant comprises an acid diluted in an inert gas.

7. The method as recited in claim 5, wherein said etchant comprises $NF_3$ or $ClF_3$ diluted in nitrogen or argon.

8. The method as recited in claim 1, further comprising:
   removing said pad oxide layer prior to said growing a sacrificial oxide, wherein
      said removing said pad oxide layer is performed in the common chamber without opening the common chamber.

9. The method as recited in claim 1, wherein said growing a sacrificial oxide layer comprises growing said pad oxide layer into said semiconductor substrate.

10. The method as recited in claim 4, wherein the sacrificial oxide layer is grown to a depth within said semiconductor substrate below said Kooi ribbon.

11. The method as recited in claim 4, wherein said removing a sacrificial oxide layer results in the removal of said Kooi ribbon.

12. The method as recited in claim 1, wherein said removing said sacrificial oxide layer comprises subjecting said sacrificial oxide layer to an etchant.

13. The method as recited in claim 12, wherein said etchant comprises an acid diluted in an inert gas.

14. The method as recited in claim 12, wherein said etchant comprises $NF_3$ or $ClF_3$ diluted in nitrogen or argon.

15. The method as recited in claim 1, wherein the semiconductor substrate remains within the chamber throughout said growing a field oxide, said removing the oxygen impermeable layer, said growing a sacrificial oxide layer, and said removing said sacrificial oxide layer.

* * * * *